US011721801B2

(12) United States Patent
Collins et al.

(10) Patent No.: US 11,721,801 B2
(45) Date of Patent: Aug. 8, 2023

(54) LOW RESISTANCE COMPOSITE SILICON-BASED ELECTRODE

(71) Applicant: International Business Machines Corporation, Armonk, NY (US)

(72) Inventors: John Collins, Tarrytown, NY (US); Teodor Krassimirov Todorov, Yorktown Heights, NY (US); Ali Afzali-Ardakani, Ossining, NY (US); Joel P. de Souza, Putam Valley, NY (US); Devendra K. Sadana, Pleasantville, NY (US)

(73) Assignee: International Business Machines Corporation, Armonk, Armonk, NY (US)

( * ) Notice: Subject to any disclaimer, the term of this patent is extended or adjusted under 35 U.S.C. 154(b) by 125 days.

(21) Appl. No.: 16/994,813

(22) Filed: Aug. 17, 2020

(65) Prior Publication Data

US 2022/0052316 A1    Feb. 17, 2022

(51) Int. Cl.
*H01M 4/1395* (2010.01)
*H01L 21/02* (2006.01)
(Continued)

(52) U.S. Cl.
CPC .... *H01M 4/1395* (2013.01); *H01L 21/02123* (2013.01); *H01M 4/366* (2013.01); *H01M 4/386* (2013.01); *H01M 4/405* (2013.01)

(58) Field of Classification Search
CPC .... H01M 4/134; H01M 4/1395; H01M 4/366; H01M 4/386; H01M 4/405;
(Continued)

(56) References Cited

U.S. PATENT DOCUMENTS

| 4,339,869 A | 7/1982 | Reihl et al. |
| 5,885,898 A | 3/1999 | Kim et al. |

(Continued)

FOREIGN PATENT DOCUMENTS

| JP | 2011077222 A | 4/2011 |
| WO | WO2011156419 A2 | 12/2011 |

(Continued)

OTHER PUBLICATIONS

Aravindan Vanchiappan et al: "Lithium-Ion Conducting Electrolyte Salts for Lithium Batteries", Chemistry—A European Journal, vol. 17, No. 51, Dec. 16, 2011 (Dec. 16, 2011), pp. 14326-14346, XP055859691, ISSN: 0947-6539, DOI: 10.1002/chem. 201101486.
(Continued)

*Primary Examiner* — Matthew T Martin
*Assistant Examiner* — Ankith R Sripathi
(74) *Attorney, Agent, or Firm* — Daniel Morris; Otterstedt & Kammer PLLC

(57) ABSTRACT

A silicon-based electrode forms an interface with a layer pair being: 1. a thin, semi-dielectric layer made of a lithium (Li) compound, e.g. lithium fluoride, LiF, disposed on and adheres to the electrode surface of the silicon-based electrode and 2. an molten-ion conductive layer of a lithium containing salt (lithium salt layer) disposed on the semi-dielectric layer. One or more device layers can be disposed on the layer pair to make devices such as energy storage devices, like batteries. The interface has a low resistivity that reduces the energy losses and generated heat of the devices.

15 Claims, 9 Drawing Sheets

(51) Int. Cl.
*H01M 4/36* (2006.01)
*H01M 4/38* (2006.01)
*H01M 4/40* (2006.01)

(58) Field of Classification Search
CPC . H01M 2300/0082; H01M 2300/0091; H01M 2300/0094; H01L 21/02123
See application file for complete search history.

(56) References Cited

U.S. PATENT DOCUMENTS

| | | | |
|---|---|---|---|
| 6,025,225 A * | 2/2000 | Forbes | H01L 28/82 257/E21.651 |
| 6,900,114 B2 | 5/2005 | Ohmi et al. | |
| 7,368,332 B2 | 5/2008 | Moriwaki et al. | |
| 7,719,035 B2 | 5/2010 | Besser | |
| 7,847,186 B2 | 12/2010 | Sawada et al. | |
| 8,889,295 B2 | 11/2014 | Yushin et al. | |
| 9,385,130 B2 | 7/2016 | Fukushima | |
| 10,199,469 B2 | 2/2019 | Nam et al. | |
| 10,581,109 B2 | 3/2020 | de Souza | |
| 10,644,356 B2 | 5/2020 | de Souza et al. | |
| 10,777,842 B2 | 9/2020 | de Souza et al. | |
| 2014/0227578 A1 | 8/2014 | Yoshida | |
| 2016/0013479 A1 * | 1/2016 | Iwasaki | H01M 4/0402 429/305 |
| 2017/0098823 A1 | 4/2017 | Yushin et al. | |
| 2017/0324097 A1 | 11/2017 | Lee et al. | |
| 2019/0115625 A1 | 4/2019 | Sadana et al. | |
| 2019/0214082 A1 | 7/2019 | Li et al. | |
| 2020/0014018 A1 | 1/2020 | de Souza et al. | |
| 2020/0014058 A1 | 1/2020 | de Souza et al. | |
| 2020/0014059 A1 | 1/2020 | de Souza et al. | |
| 2020/0014060 A1 | 1/2020 | de Souza et al. | |
| 2020/0020895 A1 | 1/2020 | Collins et al. | |
| 2020/0212492 A1 | 7/2020 | Collins et al. | |
| 2020/0335826 A1 | 10/2020 | Collins et al. | |
| 2020/0395628 A1 | 12/2020 | Collins et al. | |
| 2020/0403190 A1 | 12/2020 | Collins et al. | |
| 2021/0151719 A1 | 5/2021 | Collins et al. | |
| 2021/0265606 A1 | 8/2021 | Dang et al. | |
| 2021/0336263 A1 * | 10/2021 | Wang | H01M 10/052 |
| 2021/0351405 A1 * | 11/2021 | Feng | C01B 32/21 |
| 2021/0399275 A1 | 12/2021 | Collins et al. | |
| 2021/0399346 A1 | 12/2021 | Collins et al. | |
| 2022/0052378 A1 * | 2/2022 | Tulodziecki | H01M 10/052 |
| 2022/0085363 A1 * | 3/2022 | Jana | H01M 4/366 |
| 2023/0006194 A1 | 1/2023 | Sadana | |

FOREIGN PATENT DOCUMENTS

| | | |
|---|---|---|
| WO | WO2017/093074 | 11/2016 |
| WO | WO2017190135 A1 | 11/2017 |
| WO | WO2019077426 A1 | 4/2019 |
| WO | WO2020008285 A1 | 1/2020 |

OTHER PUBLICATIONS

PCT International Search Report (ISR) and Written Opinion (WO), completion date Nov. 17, 2021 and dated Nov. 26, 2021.

U.S. Appl. No. 17/366,521, filed Jul. 2, 2021 and any related art cited in this Application.

"Investigation on MOCVD CoSi2 process for reduction of contact resistance at metal-silicon interface" E. S. Hwang; B. M. Seo; J. H. Myeong; J. Y. Cho; J. M. Lee; K. Hong; S. K. Park 2011 IEEE International Interconnect Technology Conference Year: 2011, pp. 1-3.

* cited by examiner

LOW RESISTANCE COMPOSITE SILICON-BASED ELECTRODE

BACKGROUND

The present invention relates to interfaces with silicon-based layers with reduced interfacial resistance/impedance. More specifically, the invention relates to combined lithium containing conductive and structural enhancing layers interfacing with silicon-based layers to reduced interfacial and charge-transfer resistance in energy storage devices.

The integration of energy storage devices, e.g. batteries, in microprocessor and memory chips is an important requirement for IoT (Internet of Things) devices. In addition to IoT applications, emerging applications integrating on-board next generation energy storage devices include mobile devices; telecommunications equipment, remote power for: drones, vehicles, robotics, sensory equipment; autonomous environmental, biological, and social functioning machines; smart dust; and/or biomedical sensory/medication-delivery devices.

Further, there is a need to scale electrochemically active materials and electrochemical processes while integrating them with conventional applications, e.g., electric vehicles, mobile computing and telecommunication devices, grid storage, etc.

As human controlled and autonomous devices increasingly become miniaturized, total energy consumption requirements from the energy sources powering the electronic devices will decrease. However, even though power consumption is expected to be lower than 1 Watt for these integrated devices, the energy and power density per unit volume will continue to increase for miniaturized devices because miniaturization causes device volumes to decrease as well.

To achieve this higher energy and power density per unit volume, lithium electrode material is integrated into the overall cell structures of semi-solid or all solid-state energy storage devices due to lithium (Li) metal's extremely high theoretical specific capacity (~3860 mAh/g). In many applications, lithium-based energy storage devices will be embedded in and/or interface with Complementary Metal Oxide Semiconductor (CMOS) circuits and therefore one or more lithium-based components will interface with silicon (Si) layers. It is also assumed that whatever high energy/power dense storage device which can be fabricated and mass produced on a miniaturized scale, is directly applicable for scalable applications such as mobile electronics, electric vehicles, renewable grid storage, etc.

There is need for low resistance interfaces between silicon-base layers and lithium-based, components, particularly in storage devices with high energy and power density. These low resistance interfaces are needed to reduce power losses, improve efficiencies, and/or to prevent degradation of the silicon-active electrode containing devices due to volume expansion, over-heating, or Li-dendrite formation within these devices.

SUMMARY

According to an embodiment of the present invention a composite electrode comprising a silicon-based electrode with two layers in combination (a layer pair) is disclosed. The layer pair includes: 1. a thin, semi-dielectric, Li-conductive layer made of a lithium (Li) compound, e.g. lithium fluoride, LiF, disposed on and adhering to an electrode surface of the silicon-based electrode and 2. a molten Li-ion concentrated, conductive layer of a lithium containing salt (lithium salt layer) disposed on the semi-dielectric layer. The lithium salt layer is highly conductive for lithium ions ($Li^+$).

One or more device layers can be disposed on the layer pair. Non-limiting examples of device layers include one or more cathode electrodes, one or more solid polymer electrolyte (SPE) layers or a liquid electrolyte layer, one or more anode layers, and/or one or more other internal battery component layers.

The layer pair creates an interface between the device layers and silicon-based electrode with a surprisingly low impedance/resistance due to the layer pairs effect on lowering charge transfer resistance across the silicon interface as well as the electrolyte/layer pair interface. The layer pair has uses in devices with silicon-based electrodes, including micro-resistors, next generation ion-based analog memory devices, and energy storage devices like lithium ion batteries.

BRIEF DESCRIPTION OF THE DRAWINGS

Various embodiments of the present invention will be described below in more detail, with reference to the accompanying drawings, now briefly described. The Figures show various apparatus, structures, and process steps related to embodiments of the present invention.

DETAILED DESCRIPTION

Figure 1:
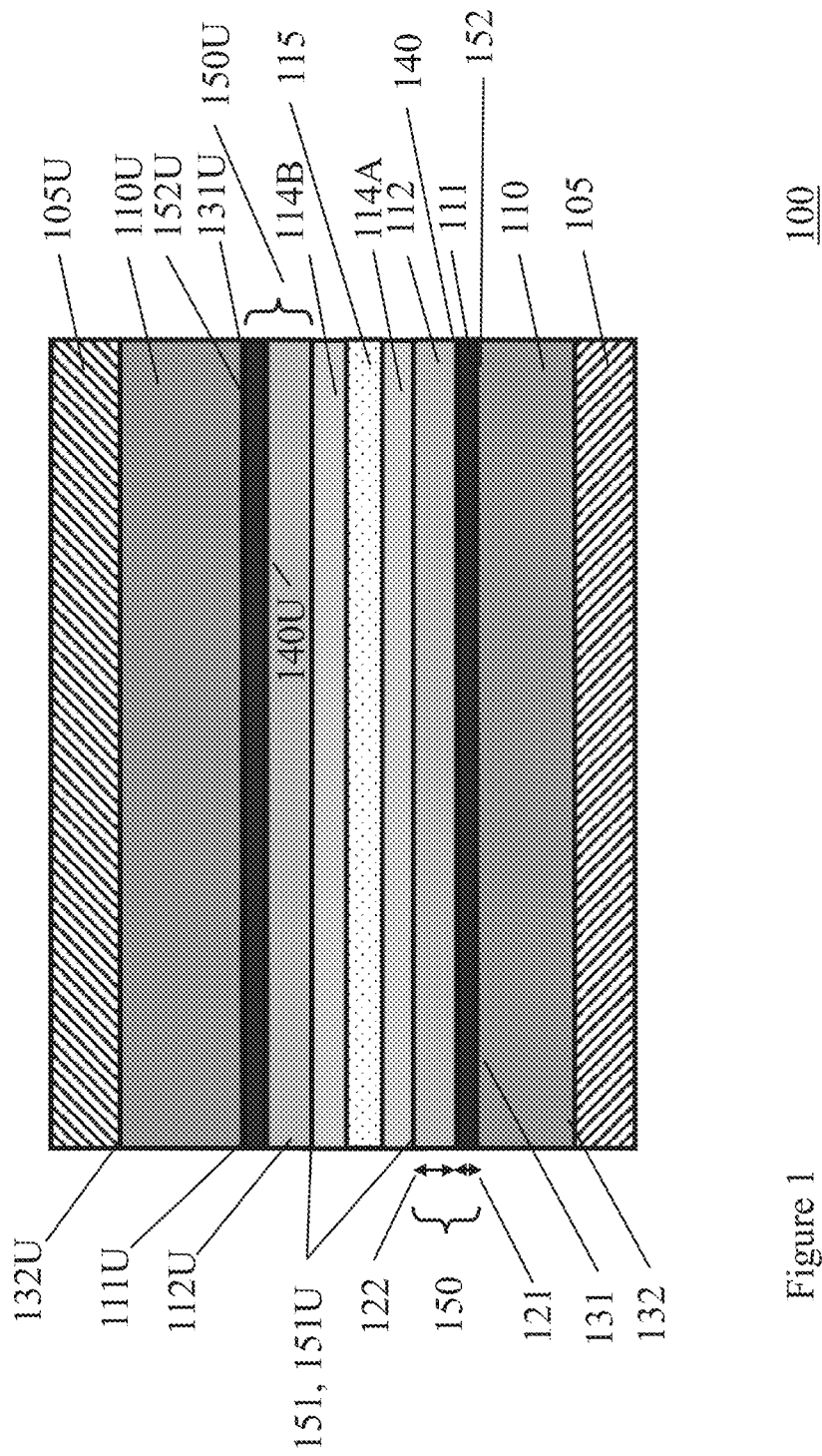
FIG. 1 is a cross sectional view of one embodiment of a symmetric cell containing two layer pairs disposed symmetrically between two silicon-based electrodes and around a separation layer.

It is to be understood that embodiments of the present invention are not limited to the illustrative methods, apparatus, structures, systems and devices disclosed herein but instead are more broadly applicable to other alternative and broader methods, apparatus, structures, systems and devices that will become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, semiconductors, personal computers, communication networks, electronic commerce systems, portable communications devices (e.g., cell and smart phones), solid-state media storage devices, expert and artificial intelligence systems, functional circuitry, neural networks, etc. Systems and hardware incorporating the invention in semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Refer now to the Figures.

FIG. 1 is a cross sectional view of one embodiment of a symmetric cell 100 containing two layer pairs (150/150U) disposed symmetrically between two silicon-based electrodes 105/105U and around a separation layer 115. The symmetric cell 100 is used in an Electrochemical Impedance Spectroscopy (EIS) analysis described below.

Each of the layer pairs 150/150U is made of a semi-dielectric layer 111/111U and a molten-ion conductive layer 112/112U, respectively. The molten-ion conductive layers 112/112U each have a respective interface 140/140U with the semi-dielectric layer 111/111U. Each of the semi-dielectric layers 111/111U has a semi-dielectric layer thickness 121 and each of the molten-ion conductive layers 112/112U has a molten-ion conductive layer thickness 122.

Each silicon-based electrode 105/105U combine with the respective layer pair 150/150U to form a composite electrode 105/150.

The separator layer 115 electrically insulates the layer pair 150 and silicon-based electrode 110 on one side of the separator layer 115 from the layer pair 150U and silicon-based electrode 110U on the other side of the separator layer 115. In other words, the separator layer 115 substantially prevents the flow of electrons between the layer pairs 150/150U and silicon-based electrodes 110/110U on opposing sides of the separator layer 115. This prevents the electrical shorting of the cell 100. However, the separator layer 115 does allow ions, e.g. lithium ions (Li+) to pass through. Therefore, the separator layer 115 permits an ionic current to flow while preventing the far majority of electron current.

A solid polymer electrolyte (SPE) layer 114 is included. In this embodiment 100, the separator layer 115 splits the solid polymer electrolyte (SPE) layer 114 into an upper SPE layer 114B above the separator layer 115 and a lower SPE layer 114A below the separator layer 115. The SPE layer 114A/114B saturates through the separator layer 115 as well.

In some embodiments, the electrolyte layer 114 (e.g. 114A/l 14B) is composed of a garnet/polymer electrolyte composite (e.g., $Li_{6.5}La_3Zr_{1.5}Ta_{0.5}O_{12}$/PEO composites) which function both as a solid polymer electrolyte 114 and a separator 115. In other embodiments, if the electrolyte is harder than Li-metal (e.g., sputtered LiPON, then no separator is needed because the electrolyte acts as both separator and electrolyte.

In this FIG. 1 the "U" in the reference number represents that the layer is in a relative position above (or opposite from) and symmetrically around the separation layer 115 with respect to the layer without the "U" in the reference number. In following discussions, the "U" in common numeric designators may be left out for clarity when descriptions of the layers that are common and symmetrical, without loss of generality.

The layer pair 150 has a pair top surface 151 (separator 115 side surface) and a pair bottom surface 152 (electrode side surface 152/152U). The layer pair 150 is directly disposed on a silicon-based electrode 110 so that the pair bottom surface 152 is in direct physical and electrical contact with an electrode pair surface 131 (semi-dielectric layer 111 side) of the silicon-based electrode 110. An electrode interface 131/152 (131U/152U, respectively) is where the pair bottom surface 152 (electrode side surface 152/152U) and the electrode pair surface 131/131U, respectively, are in direct contact.

In some embodiments, the silicon-based electrode 110/110U is disposed on an electrode contact 105/105U, respectively. The silicon electrode-based 110 has a silicon-based electrode surface 132/132U in electrical contact with the electrode contact 105/105U and the electrode pair surface 131/131U is in electrical contact at the electrode interface 131/152 (131U/151U, respectively) with the semi-dielectric layer 111 the pair bottom surface 152 (or semi-dielectric layer bottom surface 152, i.e. the electrode contact 105 side). In some embodiments, the silicon-based electrode 110 is a disc with a diameter of about 15.5 millimeters (mm) and with the electrode pair surface 131 area of about 1.88 cm$^2$.

The optional electrode contact 105/105U is made of a conductive material, e.g. a metal, such as, for example, copper (Cu), titanium (Ti), platinum (Pt), nickel (Ni), aluminum (Al), gold (Au), tungsten (W), or titanium nitride (TiN). The electrode contact 105/105U may include a single layer of a conductive metal, e.g. a conductive metal nitride, or a material stack including at least two different conductive metals and/or conductive metal nitrides. In one example, the electrode contact 105 can include a stack (not shown) of, from bottom to top, titanium (Ti), platinum (Pt) and titanium (Ti). The electrode contact 105 can be formed utilizing deposition techniques well known to those skilled in the art.

If present, the electrode contact 105 may be mechanically or chemically attached, adhered, or bonded with the silicon electrode surface 132 of the silicon-based electrode 110.

The silicon electrode-based 110/110U may include a semiconductor material and/or any other material having semiconductor properties along with silicon. In one embodiment, the silicon-based electrode 110/110U is a bulk semiconductor substrate. By "bulk" it is meant that the base substrate is entirely composed of at least one semiconductor material, e.g. crystalline silicon. In one example, the silicon-based electrode 110/110U may be entirely composed of silicon which may be single crystalline. In some embodiments, the bulk semiconductor may include a multilayered semiconductor material stack including at least two different semiconductor materials, one of which is silicon. In one example, the multilayered semiconductor material stack may comprise, in any order, a stack of Si and a silicon germanium alloy. In another embodiment, the multilayered semiconductor material may comprise, in any order, a stack of Si and single or multiple silicon-based alloys, such as silicon-germanium or carbon-doped silicon-based alloys.

In accordance with the present application, the silicon electrode 110 is composed of a silicon-containing material, i.e., the silicon electrode 110 is silicon-based. The term "silicon-based" is used throughout the present application to denote a material that includes at least silicon and has semiconductor material properties. Examples of silicon-based materials that made can be employed as the silicon-based electrode 110 include silicon (Si), a silicon germanium alloy, or a carbon-doped silicon-based alloy. Typically, the silicon-based electrode 110 is composed entirely of silicon (Si).

The silicon-based materials that provided in the silicon-based electrode 110 can be non-crystalline semiconductor materials or crystalline semiconductor materials. The silicon-based electrode 110 may be entirely non-porous, entirely porous or contain some regions that are non-porous and other regions that are porous. The silicon containing materials may be non-doped, doped, or contain some regions that are doped and other regions that are non-doped. The dopant can be a p-type dopant or an n-type dopant.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of p-type dopant within the silicon-containing material that provides silicon-based electrode 110 can range from 1E16 atoms/cm$^3$ to 3E20 atoms/cm$^3$.

The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within the silicon-containing material of the silicon-based electrode 110/110U can range from 1E16 atoms/cm$^3$ to 1E21 atoms/cm$^3$.

Illustrative examples of silicon-containing materials that can used as the silicon-based electrode 110/110U include non-porous silicon, partially porous crystalline silicon, single-crystal non-porous silicon, crystalline silicon, a low resistance doped crystalline silicon, boron doped crystalline silicon or boron doped crystalline porous silicon. In one embodiment, boron doped crystalline silicon having a boron dopant concentration of from $1\times10^{19}$ atoms/cm$^3$ to $3\times10^{20}$ atoms/cm$^3$ is used as the silicon-based electrode 110.

The term "low resistance doped crystalline silicon" denotes a silicon-based electrode 110 that is of unitary construction (i.e., a monolith structure) and includes a non-porous region and a porous region, as defined in U.S. Ser. No. 16/026,461 entitled "Battery Structure with an Anode Structure Containing a Porous Region and Method of Operation", filed on Jul. 3, 2018, the entire content and disclosure of which is incorporated herein by reference.

The low resistance doped crystalline silicon that can be used as the silicon-based electrode 110/110U can be made using an anodization process in which a substrate including at least an upper region of a p-type silicon material, which has been cleaned using a standard organic cleaning process, is immersed into a solution of concentrated HF (49%) while an electrical current is applied with platinum as the anode and the substrate as the cathode. The anodization process is performed utilizing a constant current source that operates at a current density from 0.05 mA/cm$^2$ to 150 mA/cm$^2$, wherein mA is milli-Amperes. In some examples, the current density is 1 mA/cm$^2$, 2 mA/cm$^2$, 5 mA/cm$^2$, 50 mA/cm$^2$, or 100 mA/cm$^2$. In a preferred embodiment, the current density is from 1 mA/cm$^2$ to 10 mA/cm$^2$. The current density may be applied for 1 second to 5 hours. In some examples, the current density may be applied for 5 seconds, 30 seconds, 20 minutes, 1 hour, or up to 3 hours. In an embodiment, the current density may be applied for 10 seconds to 4800 seconds, specifically for the doping level in the range $10^{19}$ atoms/cm; range. The anodization process is typically performed at nominal room temperature from (20° C.) to 30° C.) or at a temperature that is slightly elevated from room temperature. Following the anodization process, the structure is typically rinsed with deionized water and then dried.

The semi-dielectric layer 111 (111U) is a thin layer 121 that adheres well to the silicon-based electrode 110 (110U, respectively) at the electrode pair surface 131, electrode interface 131/151 (131U/151, respectively). The thickness 121 of the semi-dielectric layer 111 involves a tradeoff. Since the semi-dielectric layer 111 is an electrical insulator, using a dielectric material in contact with the electrode pair surface 131 normally would increase the resistance/impedance at the electrode interface 131/152 (131U/152U) and between the silicon-based electrode 110 and the molten-ion conductive layer 112. However, keeping the semi-dielectric layer 111 very thin 121 reduces this resistance at the electrode interface 131/152. Still the thickness 121 of the semi-dielectric layer 111 has to be large enough to enable strong adhesion to the silicon-based electrode 110 and maintain a uniform contact across the entire electrode pair surface 131. In some embodiments, the thickness 121 of the semi-dielectric layer 111 is between 15 nanometers (nm) and 30 nm. In other embodiments, the thickness 121 is between 15 nm and 23 nm and in other embodiments, the thickness 121 is between 18 nm and 23 nm.

In some embodiments, the semi-dielectric layer 111 is made of a dielectric containing lithium. In some embodiments, the semi-dielectric layer 111 is made of lithium fluoride (LiF). The lithium fluoride semi-dielectric layer 111 can be deposited on the silicon-based electrode 110 by evaporation on the electrode pair surface 131 forming an amorphous lithium fluoride layer 111 directly disposed on the silicon-based electrode 110 electrode pair surface 131 and forming the electrode interface 131/152.

The semi-dielectric layer 111 can be made of other materials including but not limited to titanium dioxide, niobium oxide, rubidium oxide, tungsten oxide, aluminum oxide, zinc oxide, zirconium oxide, and lithiated versions of any of the foregoing.

The evaporation includes providing a source material of lithium fluoride. The source material is then evaporated in a vacuum. The vacuum allows vapor particles of the lithium fluoride, LiF, to travel to the silicon-based electrode 110, where the vapor particles condense back to a solid state. The evaporation includes an evaporation apparatus that contains at least a vacuum pump and an energy source that evaporates the source material, e.g. LiF, to be deposited. The evaporation process may include, but is not limited to, e-beam evaporation, thermal evaporation using Ni, Ta, Mo, or W boat or radio frequency (RF) sputtering. The pressure during deposition is typically controlled from 10E-8 to 10E-4 Torr and the temperature from 875° C. to 1180° C. The thickness 121 of the semi-dielectric layer 111 can be controlled either through pre-measuring the mass of the evaporated material or through quartz microbalance rate monitor.

In some embodiments, crystalline boron doped (at above defined concentrations) silicon discs 110, ⅝" in diameter, were etched in a 4% to 10% concentration of hydrofluoric acid between 25 seconds and 60 seconds to remove native oxide layers. These silicon discs were then immediately mounted to a steel plate 105 and vacuum sealed as the target object in an evaporation system located inside a nitrogen environment glove box. A layer of lithium fluoride, LiF, was thermally evaporated using a premeasured amount of between 3.5 to 6.5 milligrams (mg) of LiF weighed out and deposited into a conductive powder sample holder, which is attached to the user controlled power source of an evaporation system. The LiF powder was resistively heated in the tungsten boat and fully evaporated under a vacuum of less than $2 \times 10^{-5}$ bar by applying current from 20 Amps to 50 Amps which heated the boat to over 1100° C.

The molten-ion conductive layer 112 is then deposited on the semi-dielectric layer 111 to complete formation of the layer pair 150. Deposition of the molten-ion conductive layer 112 forms a pair interface 140 between the semi-dielectric layer 111 and the molten-ion conductive layer 112. The pair top surface 151 is a surface of the molten-ion conductive layer 112 opposite the pair interface 140.

The molten-ion conductive layer 112 is made of a material highly conductive to ions, in particular, highly conductive to lithium ions (Li+). In some embodiments, the molten-ion conductive layer 112 is made of a lithium containing salt. In some embodiments, the molten-ion conductive layer 112 is made of one or more of the following lithium containing salts: lithium hexafluorophosphate, lithium perchlorate, lithium trifluoromethanesulfonate, lithium fluoride, $LiBF_4$, $LiBF_6$, lithium chloride, lithium phosphate compounds, lithium bromide compounds, lithium bis(trifluoromethanesulfonyl)imide (LiTFSI), lithium difluoro(oxalato)borate (LiDFOB), or lithium bis(oxalato)borate (LiBOB).

In some embodiments, the molten-ion conductive layer 112 is made of bis(trifluoromethanesulfonyl)imide (LiTFSI).

The molten-ion conductive layer 112 can be formed by depositing a layer of a lithium containing salt, as defined above, on the semi-dielectric layer 111. The depositing of the layer of the lithium containing salt may include any conventional deposition technique such as, for example, drop coating and then using a doctor blade to provide a homogeneous and uniform layer of the lithium containing salt on the surface of the semi-dielectric layer 111. Next, the layer of the lithium containing salt is heated to a temperature that provides a molten lithium containing salt. In some embodiments of the present application, the heating can be performed at a temperature of greater than 350 degrees Celsius (° C.) to provide molten lithium ions. The heating can be performed in an inert ambient such as, for example, helium (He), neon (Ne), argon (Ar) and/or nitrogen ($N_2$). In one example, heating is performed at 415° C. in a nitrogen glove box. The molten salt has increased adhesion (wetting) of high concentrated mobile lithium on the semi-dielectric layer 111 providing a uniform layer thickness 122. The molten lithium containing salt is then cooled to form the molten-ion conductive layer 112 composed of the molten lithium containing salt. Cooling is performed from the heating temperature to nominal room temperature which can be in a range from 15° C. to 25° C., or below. Once cooled, the molten-ion conductive layer 112 is a solid, continuous layer that forms on the semi-dielectric layer 111 at the pair interface 140.

In some embodiments, the molten-ion conductive layer 112 can have a thickness 122 between 1 nm to 500 nm. In other embodiments, the molten-ion conductive layer 112 can have a thickness 122 between 1 nm to 50 nm. Other thicknesses are envisioned.

The order of layer deposition can reverse when on opposite sides of the separation layer 115.

Figure 2:
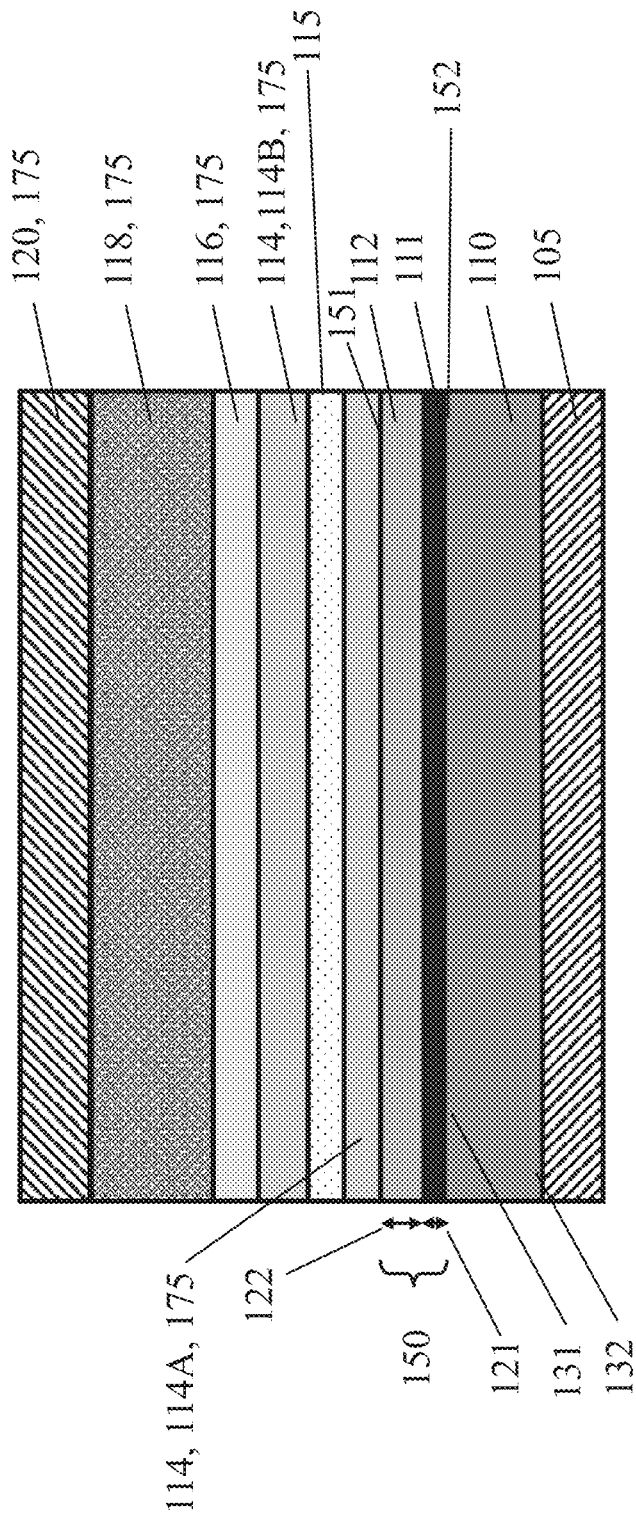
FIG. 2 is a cross sectional view of an alternative embodiment of a cell containing a layer pair disposed on a silicon-based electrode with a separation layer between solid polymer electrolyte (SPE) layers and some of the device layers disposed on the layer pair.

FIG. 2 is a cross sectional view of an alternative embodiment 200 of a single layer pair 150 disposed on a silicon-based electrode 110 with one or more device layers 175 disposed on the layer pair 150.

A solid polymer electrolyte (SPE) layer 114 is included. In this alternative embodiment 200, the separator layer 115 splits the solid polymer electrolyte (SPE) layer 114 into an upper SPE layer 114B above the separator layer 115 and a lower SPE layer 114A below the separator layer 115.

In some embodiments, the electrolyte layer 114 is composed of a garnet/polymer electrolyte composite (e.g., $Li_{6.5}La_3Zr_{1.5}Ta_{0.5}O_{12}$/PEO composites) which function both as a solid polymer electrolyte 114 and a separator 115. In other embodiments, if the electrolyte is harder than Li-metal (e.g., sputtered LIPON, then no separator is needed because the electrolyte acts as both separator and electrolyte.

In FIG. 2, layers 175 (e.g. 114 (114A and 114B), 115, 116, 118, 120) formed on the pair top surface 151 are called device layers, typically 175. Device layers 175 can take multiple forms and can be in multiple combinations depending on the structure of the device/embodiment 100. As described below, the combination of the silicon-based electrode 110, the layer pair 150, and one or more device layers 175 will have a reduced resistance/impedance through the entire structure resulting from the reduced resistance/impedance at the electrode interface 131/152 between the pair layer 150 and the silicon-based electrode 110.

In one battery embodiment, an electrolyte layer 114 is disposed on the pair top surface 151 as a device layer 175. The electrolyte layer 114 can be any known electrolyte used in prior art batteries. In one embodiment, the electrolyte layer 114 is made of a solid electrolyte or a solid polymer electrolyte (SPE).

Non-limiting embodiments of the solid polymer electrolyte layer (SPE) 114 include any solid polymer material that can conduct Li ions. In one embodiment, the solid polymer electrolyte layer 114 is composed of a mixture of a polymer structure host material, a Li-conductive/plasticizing material, and a lithium containing salt.

In such an embodiment, the mixture includes from 35 weight percent to 50 weight percent of the polymer structure host material, from 15 weight percent to 25 weight percent of the conductive/plasticizing material, and from 30 weight percent to 45 weight percent of the lithium containing salt. In some embodiments, the polymer host material and conductive/plasticizing material are dissolved into anhydrous acetonitrile with a solid:solvent ratio between 1:2 to 1:10, with one preferred ratio of 1:3. The mixture can be made utilizing techniques well known to those skilled in the art.

Illustrative examples of polymer structure host materials include at least one of poly(ethylene oxide) (PEO), poly(propylene oxide) (PPO), poly(dimethylsiloxane), poly(vinyl chloride), or polycaprolactone.

Illustrative examples of Li-conductive/plasticizing material include at least one of succinonitrile (SN), poly(ethylene glycol) (PEG), an aprotic organic solvent, and/or dimethylsulfoxide (DMSO).

Illustrative lithium containing salts that can be used in forming the solid polymer electrolyte layer include, but are not limited to, lithium hexafluorophosphate, lithium perchlorate, lithium trifluoromethanesulfonate, lithium fluoride, $LiBF_4$, lithium chloride, lithium phosphate compounds, lithium bromide compounds, lithium bis(trifluoromethanesulfonyl)imide (LiTFSI), lithium difluoro(oxalato)borate (LiDFOB), or lithium bis(oxalato)borate (LiBOB).

The lithium containing salt that is present in the solid polymer electrolyte (SPE) layer 114 can be the same as, or different from, the lithium containing salt that is used in providing the molten-ion conductive layer 112. Typically, the lithium containing salt used in the solid polymer electrolyte layer 114 is the same as that used for the molten-ion conductive layer 112. In one embodiment, the lithium containing salt used in the solid polymer electrolyte layer 114 and in the molten-ion conductive layer 112 are both made of lithium bis(trifluoromethanesulfonyl)imide (LiTFSI).

In one exemplary embodiment, the silicon-based electrode 110 is composed of boron doped crystalline silicon, the semi-dielectric layer 111 is made of LiF, the molten-ion conductive layer 112 made of bis(trifluoromethanesulfonyl)imide (LiTFSI), and the solid polymer electrolyte layer 114 is made of a mixture of polycaprolactone, succinonitrile (SN), and lithium bis(trifluoromethanesulfonyl)imide (LiTFSI).

The solid polymer electrolyte layer 114 may be formed utilizing a deposition process such as, drop casting, spin coating, doctor blading, etc.

In some embodiments, an optional interfacial layer 116 can form on the solid polymer electrolyte layer 114. The optional interfacial layer 116 may have a thickness from 1 nm to 50 nm. In some embodiments, the interfacial layer 116 is omitted. When present, the interfacial layer 116 forms an interface 116 between the solid polymer electrolyte layer 114 and a counter electrode 118.

In some embodiments, the interfacial layer 116 is a solid electrolyte interphase (SEI) layer which develops on the cathode/electrolyte interface upon electrochemical cycling. The interfacial layer 116 is conductive to Li-ions but not to electrons.

In some embodiments (typically used when the counter electrode 118 is made of a silicon-containing material similar to or the same as the material that makes the silicon-based electrode 110), the interfacial layer 116 is composed of a lithium containing salt. The lithium containing salt making the interfacial layer 116 can be one or more of the lithium containing salts used in the molten-ion conductive layer 112 mentioned above. In one embodiment, the interfacial layer 116 and the molten-ion conductive layer 112 are made of the same lithium containing salt. In alternative embodiments, the lithium containing salt making the molten-ion conductive layer 112 and the interfacial layer 116 are different materials. In one embodiment, the molten-ion conductive layer 112 and the interfacial layer 116 are both made of lithium bis(trifluoromethanesulfonyl)imide (LiTFSI).

In some embodiments, (typically used when the counter electrode 118 is made of a silicon-containing material similar to or the same as the material that makes the silicon-based electrode 110), the interfacial layer 116 is composed of a lithium containing salt mixed within a polymer. In one embodiment, the interfacial layer is composed of polyaniline mixed with LiTFSI lithium salt.

In some embodiments (typically used when the counter electrode 118 is made of a cathode material or electrode material), the interfacial layer 116 is composed of an interfacial additive material such as, for example, a carbon (C) based material, gold (Au) or a dielectric oxide material such as, for example, aluminum oxide. The material making the interfacial layer 116 may be a mixture with any combination of electrically insulating as well as Li-ion ionic-conducting components, such as but not limited to $LiNbO_3$, $LiZrO_2$, $Li_4SiO_4$, or $Li_3PO_4$.

As dependent on the interfacial layer 116 material chosen, the interfacial layer 116 can be formed using a deposition process including, for example, chemical vapor deposition (CVD), plasma enhanced chemical vapor deposition (PECVD), evaporation, electrochemical plating, drop casting, spin coating, or atomic layer deposition (ALD).

In embodiments where the silicon-based electrode 110 has an electrode polarity, a counter electrode 118 has a counter electrode polarity that is opposite from the electrode polarity. In some embodiments of the present application, the silicon-based electrode 110 may be an anode electrode, while the counter electrode 118 is a cathode electrode. In other embodiments of the present application, the silicon-based electrode 110 may be a cathode electrode, while the counter electrode 118 is an anode electrode.

The counter electrode 118 can be formed on the solid polymer electrolyte (SPE) layer 114, or optionally on the interfacial layer 116. The counter electrode 118 can function as anode electrode or a cathode electrode but typically, the counter electrode 18 is a lithium hosting electrode, e.g. a cathode.

In embodiments where the silicon-based electrode 110 is an anode electrode, the counter electrode 118 is a cathode electrode. In such embodiments, the cathode electrode (i.e., counter electrode 118) can also be made of a silicon-based material. When the counter electrode 118 is made of a silicon-based material, the counter electrode 118 material may be compositionally the same as, or compositionally different from the material making the silicon-based electrode 110 and can be one of the silicon-based electrode 110 materials listed above.

In some embodiments, where the counter electrode 118 acts as a cathode electrode 118 the material making the cathode electrode 118 is a lithium-containing cathode material. The lithium-containing cathode material may include a lithium-containing material such as, for example, a lithium-based mixed oxide. Examples of lithium-based mixed oxides that may be employed as the lithium-containing cathode material include, but are not limited to, lithium cobalt oxide ($LiCoO_2$), lithium nickel oxide ($LiNiO_2$), lithium manganese oxide ($LiMn_2O_4$), lithium manganese oxyfluoride ($Li_2MnO_2F$), lithium vanadium pentoxide ($LiV_2O_5$), lithium nickel manganese cobalt (NMC), nickel cobalt aluminum oxide (NCA), any combination of sulfur-based materials with lithium and other structure supporting elements such as iron, or lithium iron phosphate ($LiFePO_4$).

In some embodiments, e.g. when a polymer or liquid electrolyte 114 is used, a layer of the lithium-containing cathode (counter electrode 118) material may be formed using a deposition process such as slurry casting, laminating and calendaring, or electroplating. In one embodiment, a layer of the lithium-containing cathode material is formed by sputtering when using a non-liquid based electrolyte using any conventional precursor source material or combination of precursor source materials. In one example, a lithium precursor source material and a cobalt precursor source material are employed in forming a lithium cobalt mixed oxide.

Sputtering may be performed in an admixture of an inert gas and oxygen. In such an embodiment, the oxygen content of the inert gas/oxygen admixture can be from 0.1 atomic percent to 70 atomic percent, the remainder of the admixture includes the inert gas. Examples of inert gases that may be used include argon, helium, neon, nitrogen or any combination thereof in conjunction with oxygen.

In some embodiments, the layer of lithium-containing cathode 118 material may be formed by slurry casting, which may contain a mixture of electrochemically active [cathode materials, electron-conducting materials (e.g., carbon-based materials)] and inactive (binder materials) components. The thickness of such layers could range from 5 μm to 500 μm. These slurries may also have an electrolyte component in the mixture, along with a lithium-based salt (s).

In embodiments in which the silicon-based electrode 110 is a cathode electrode, the counter electrode 118 is an anode electrode. In such an embodiment, the anode electrode (i.e., counter electrode 118) may be a second silicon-based electrode. This second silicon-based electrode 118 may be compositionally the same as, or compositionally different from the silicon-based electrode 110.

In some embodiments, the anode electrode (i.e., counter electrode 118) includes a lithium ion source material or lithium intercalation active material. Examples of materials that may be used as the anode electrode 118 include, but are not limited to, lithium metal, a lithium-base alloy such as, for example, $Li_xSi$, pre-lithiated carbon based material, pre-lithiated silicon based material or a lithium-based mixed oxide such as, for example, lithium titanium oxide ($Li_2TiO_3$). The anode electrode can be formed utilizing deposition techniques that are well known to those skilled in the art. In some embodiments, the anode electrode can be formed by sputtering.

A current collector 120 or counter electrode 118 contact 120 may be formed atop the counter electrode 118. The current collector 120/counter electrode contact 120 is made of one or more electrically conductive materials similar or identical to those materials making the electrode contact 105. In some embodiments, the counter electrode contact 120 can be formed using techniques well known to those skilled in the art.

In the embodiment illustrated in FIG. 2, the solid polymer electrolyte layer has a lower region 14A and an upper region 14B, and a separator (or dielectric region) 115 is present between the lower region 114A and the upper region 114B. The separator (or dielectric region) 115 can be composed of at least one of polyacrylnitrile (PAN), polyethylene oxide (PEO) based copolymer matrices or structural membranes, a quarternized polysulfone membrane, electrospun polyvinylidene fluoride, or a methylmethacrylate (MMA)/polyethylene (PE) composite.

The separator layer 115 electrically insulates the silicon-based electrode 110 from the counter electrode 118. In other words, the separator layer 115 substantially prevents the flow of electrons between the silicon-based electrode 110 and the counter electrode 118. However, the separator layer 115 does allow ions, e.g. lithium ions (Li+) to pass through. Therefore, the separator layer 115 permits an ionic current to flow while substantially preventing any electron current. In some embodiments where liquid electrolyte 116 is employed, the separator material can be made of a liquid-permeable membrane, e.g., nafion.

In some embodiments, the cell 200 can be used as a micro-resistor. For example, when lithium is intercalated into an electrode, the resistance of the cell changes. By controlling the amount of lithium moved into the electrode 110 and holding the amount constant, the cell 200 has a particular resistance or resistance state. By creating or changing the resistive state of the cell, the device can be used as a resistor-based computing device where memory is stored as the state of resistance held within the cell. In some embodiments, variable resistive state cells have a cathode 118, electrolyte 114, and host anode (e.g., silicon, carbon) 110.

Figure 3:
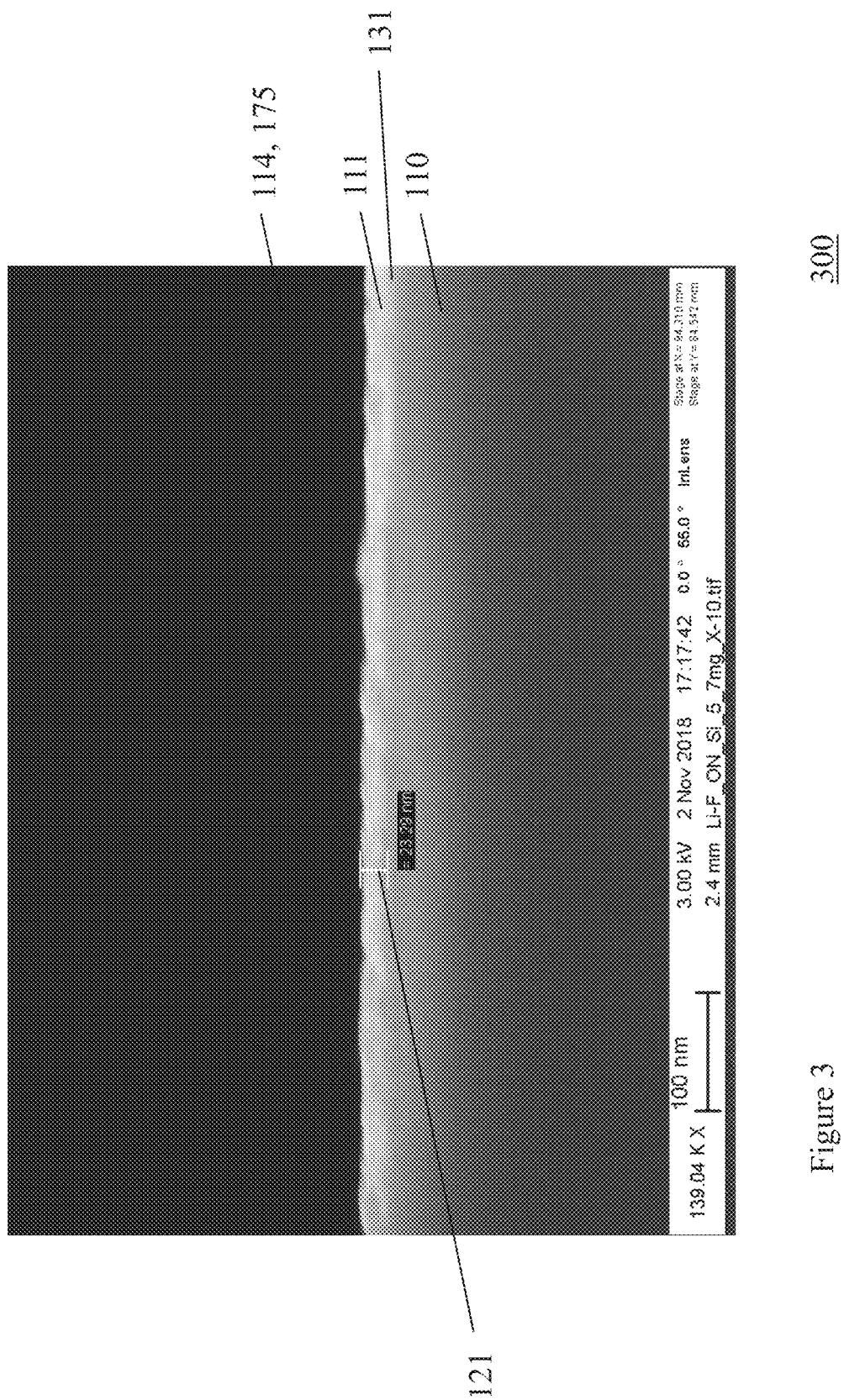
FIG. 3 is a micrograph showing a thin, semi-dielectric layer made of a Lithium (Li) compound, e.g. lithium fluoride, LiF, disposed on and adhering to an electrode surface of the silicon-based electrode.

FIG. 3 is a micrograph 300 showing a thin, semi-dielectric layer 111 made of a Lithium (Li) compound, e.g. lithium fluoride, LiF, disposed on and adhering to the electrode pair surface 131 of the silicon-based electrode 110. The thickness 121 of the semi-dielectric layer 111 is 23.29 nm. No molten-ion conductive layer 112 is shown and no layer pair 150 is formed in this micrograph 300.

The micrograph 300 does show superior adhesion of the semi-dielectric layer 111 to the silicon-based electrode 110.

The semi-dielectric layer 111 was made by evaporating 5.7 mg of LiF powder with between 30 to 33 Amps in an evaporation system and condensing the LiF on the surface 152 of the electrode pair surface 131, as described above.

Figure 4:
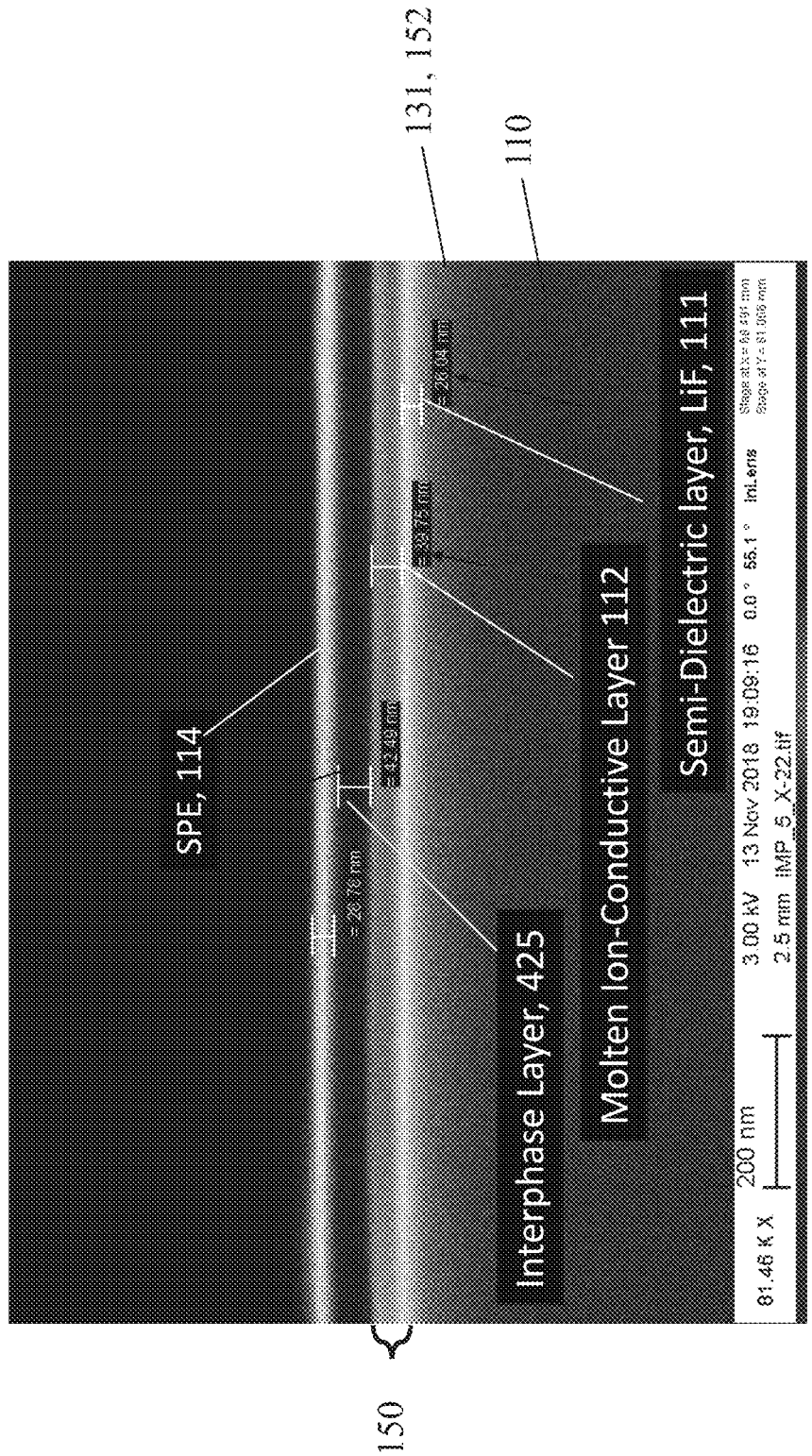
FIG. 4 is a micrograph showing a layer pair disposed on a silicon-based electrode with one or more device layers disposed on the layer pair.

FIG. 4 is a micrograph 400 showing a layer pair 150 disposed on a silicon-based electrode 110 with one or more device layers 175 disposed on the layer pair 150. The micrograph represents a structure 400 after dissection of the symmetric cell, i.e. 100, post EIS testing. The upper half (designated by "U's") of the symmetric cell 100 was separated during cleaving of the symmetric cell 100—thereby only displaying one half of the symmetric cell 100.

The semi-dielectric layer 111 is made by evaporating and condensing LiF powder as described in FIG. 3. In addition, a molten-ion conductive layer 112, is made by depositing a layer of LiTFSI salt and heating until the molten phase creates the well adhered molten-ion conductive layer 112 on the semi-dielectric layer 111 to form the layer pair 150. The layer pair 150 is formed on the silicon-based electrode 110, as described above. The semi-dielectric layer 111 is 26.04 nm thick 121 and the molten-ion conductive layer 112 is 39.75 nm thick 122. The electrode interface 131/152 is shown.

An interphase layer 425, a device layer 175, is formed by the movement of materials, ions, and electrons throughout the structure 400 once the cell is complete and contains an inherent voltage difference between the two electrodes in the device structure 400. Additionally, the small applied potential amplitude used in the EIS measurements can also facilitate the mobilization of Li-ions in the system and therefore also facilitate the formation of the interphase layer 425. Typically, interphase layers 425 occur due to reaction of the electrolyte material 114 with electrode surfaces 110/110U, to form the interphase 425. A solid electrolyte interphase (SEI) layer 425 electrically insulates the electrodes while ionically facilitating ion charge mobility. In this instance, the interphase layer 425 is 42.49 nm thick.

Figure 5:
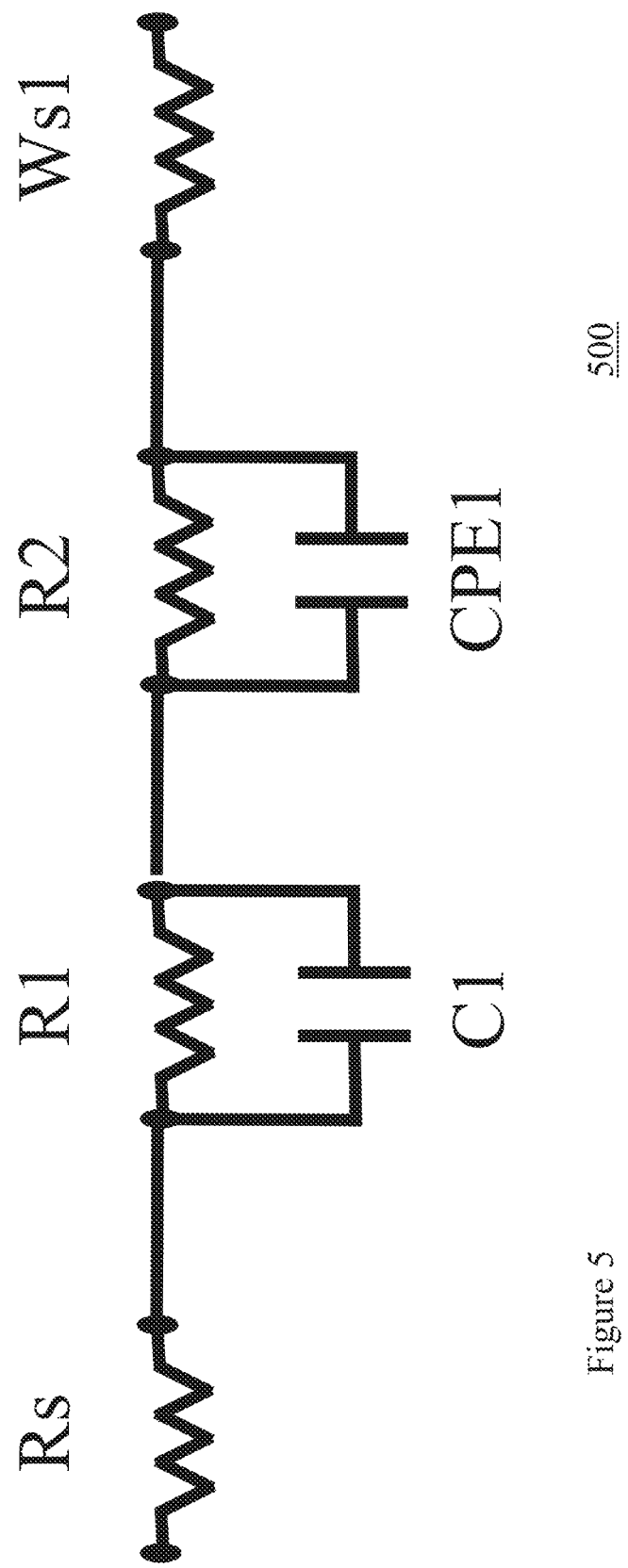
FIG. 5 is an RC (resistor/capacitor) model of an energy storage device, e.g. a symmetric cell energy storage device, used for fitting Electrochemical Impedance Spectroscopy (EIS) spectra.

FIG. 5 is an RC model 500 of a symmetric cell energy storage device, e.g., silicon/layer-pair/SPE-PAN/layer-pair/silicon, used for fitting an Electrochemical Impedance Spectroscopy (EIS) generated spectra.

Figure 6:
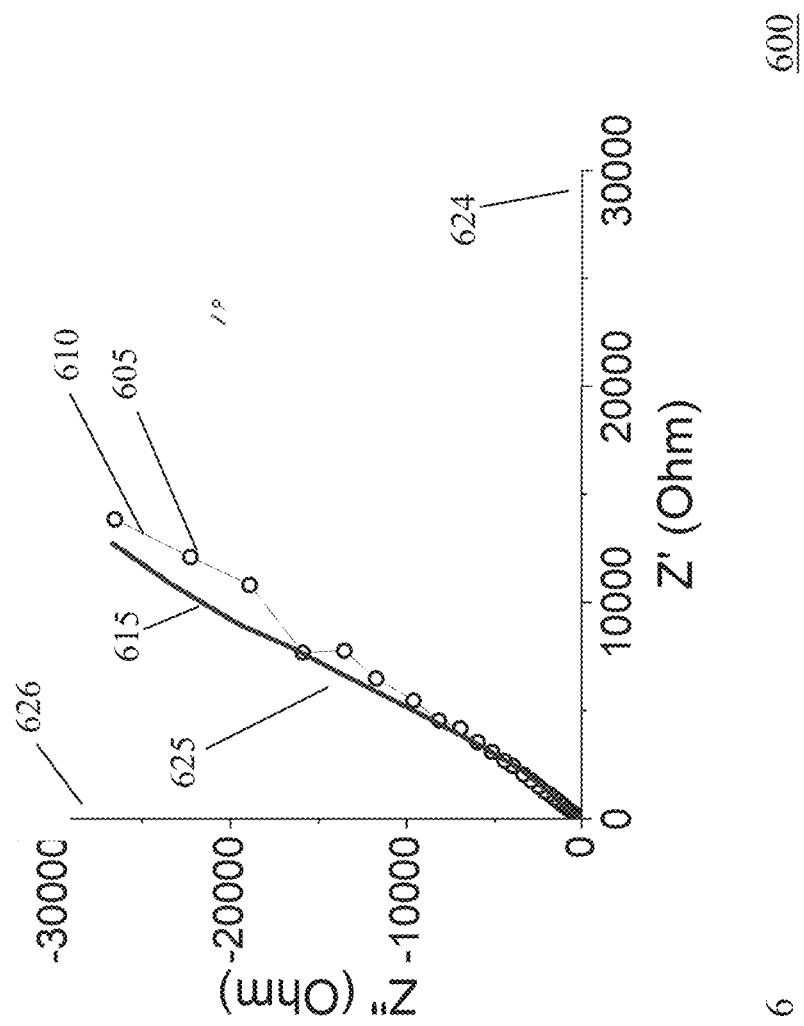
FIG. 6 is a Nyquist plot with the fitted RC model from FIG. 5 used to determine component values of the symmetric cell.

Generally, in EIS analysis, $R_s$ is measured/estimated as the real part of the impedance at the higher or highest frequency (left-most data point) of a Nyquist plot as shown in FIG. 6. $R_s$ is a pure resistive component, denoted as an ohmic or series type resistance, between the electrodes, e.g. the anode and cathode, of a battery and can often be associated with contact resistance of the cell and/or electrolyte resistance within the cell due to the electrolyte's electrical conductivity.

Generally, resistor components in the model 500 refer to resistor-like elements in the electrochemical model makeup of the cell; capacitor elements refer to an impedance component of the cell which has a voltage/current phase change (towards −90 degrees) with respect to the current flowing through resistive element in the component AC current response at a given frequency. For example, an EIS element with a high degree of capacitance character (e.g., a "C" element) corresponds to one or more surfaces in the cell 100/200 often associated with layers, e.g. unintimate contact (delaminated layers). Constant phase elements (CPE) are elements in cell impedance which can maintain a constant phase of AC current response over a given frequency range (often associated with transition layers grown or established in-situ). These elements are often utilized in RC models of best fit when interphase layers are formed in-situ and/or interfacial additive layers are adhered in-situ or ex-situ.

The model comprises a series or ohmic associated resistance, R; in series with a parallel combination of a resistor, R1, and capacitor element, C1, and its associated impedance; in turn in series with a parallel combination of resistor, R2 and a constant phase element CPE2. A "Warburg" impedance element, Ws1, is also in series.

It is posited that the combined elements R1 and C1 in the RC model 500 show the effects of the real and imaginary components of impedance detected as current at a given applied voltage (e.g., 50 mV) across the high (1 MHz) to mid (~100 Hz) frequency range, representing the electrode interface 131/152, i.e. the electrode pair surface 131 in electrical contact with the semi-dielectric layer 111 the pair bottom surface 152 (or semi-dielectric layer bottom surface 152). Hence the R1/C1 time constant present in the RC model is representative of the charge transfer resistance across the layer pair/silicon interface. The impedance of the combination of resistor, R2, and constant phase element, capacitance CPE2, is thought to represent the interface of the interphase 425 and the SPE 114. The R2/CPE2 time constant is expected to represent a higher impedance magnitude due to the in-situ interphase formation.

A Warburg impedance, Ws1, models the 100/200 impedance effects due to diffusion of ions, e.g. diffusion of lithium ions, through the electrode and electrolyte cell components. Generally, in EIS analysis of cells with high performing ion diffusion, for electrodes 110/118 and/or mass transport (electrolyte migration) associated with the electrolyte, the Warburg impedance component of the cell across the mid (~100 Hz) to low (200 mHz) frequency range is observed as a near 45 degree "straight, diagonal" section of the Nyquist plot.

The series resistance, Rs, represents a pure resistance component of impedance associated with contact resistance of the cell and/or electrolyte resistance within the cell due to the electrolyte's electrical conductivity. Accordingly, the value of resistor, Rs, has an important effect on the power losses and heat generated by the battery/cell 100/200 as it impacts the ease of charge particle mobility within the cell. The present invention, including a thin semi-dielectric layer 111 included in the layer pair 150, substantially reduces the resistance and resistance per area (resistivity) value of resistor Rs by a factor of between 5 and 10 over currently known structures. Accordingly, use of the thin semi-dielectric layer 111 within the layer pair 150 reduces power losses and heat generated by the battery/cell 100/200.

FIG. 6 is a Nyquist plot 600 along with the fitted plot 625, 615 from the RC model 500 used in EIS analysis described in FIG. 5.

The battery structure used for the Nyquist plot 600 was a symmetric cell comprising a silicon-based electrode 110 with a layer pair 150, a solid polymer electrolyte (SPE) with a polyacrylonitrile (PAN) separator, with the cell sandwiched together with a complimentary silicon-based electrode 110 with a layer pair 150. The semi-dielectric layer 111 of the layer pair 150 was a 23 nm thick 121 LiF layer. The molten-ion conductive layer 112 was made of LiTFSI salt brought approximately to, or beyond its melting temperature. The SPE layer 114 was a mixture of mixture of Polycaprolactone (PCl), succinonitrile (SN), and lithium bis(trifluoromethanesulfonyl)imide (LiTFSI) and contained a saturated polyacrylonitrile (PAN) separator.

A Nyquist plot 600 is a plot of a series of points, where each point, typically 605, is measured at a given frequency of excitation voltage across a cell, e.g. 100. At each frequency, the associated point on the Nyquist plot 600 represents the real component, Z', of total impedance of the cell (100, 200) as measured in ohms on the x-axis 624 versus the imaginary component, Z", of total impedance as measured in ohms on the y-axis 626 of the Nyquist plot 600. Typically, the imaginary components, Z", are negative values (indicating capacitance), as shown. The points 605 measured at lower frequencies are on the right side of the Nyquist plot 600 where more initially scanned/plotted points leftward have higher frequency—with the highest frequency typically being closest to the 0/0 apex point. Each point 605 is the impedance measured at one independent frequency.

Curve 610 is a line curve fitting the exact impedances measured at the respective points 605. Curve 615 is a "best fit" curve of the points 605 on curve 610, as generated from the RC model from FIG. 5. Region 625 on curve 615 is approximately linear and has a slope near 45 degrees. This indicates that the transport/diffusion of ions, e.g. lithium ions, Li+, through the cell 100/200 is efficient across a wide range of frequencies—and thereby warranting the use of the Warburg impedance element displayed in FIG. 5.

In this illustrative example, the frequency of the applied voltage varied from 1 megahertz to 200 millihertz with an excitation potential amplitude of 50 millivolts where the whole cell was biased at 0 volts.

Figure 6A:
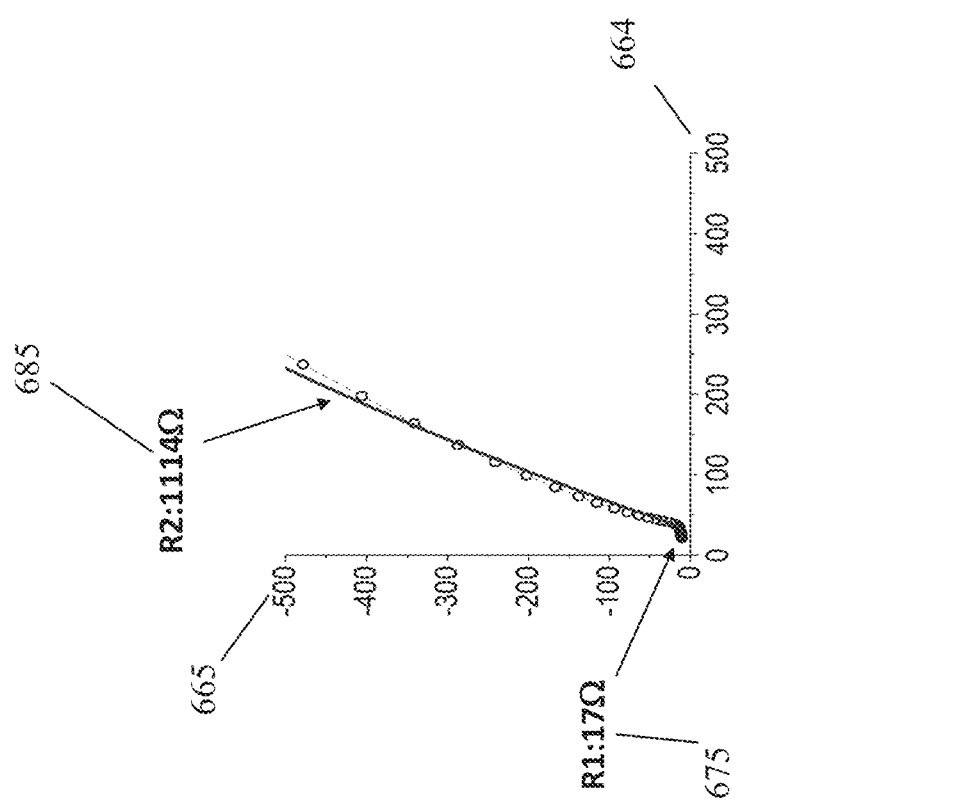
FIG. 6A is an expanded view of the high-to-mid frequency data points from the Nyquist plot in FIG. 6.

FIG. 6A is a graph of a magnified portion 650 of FIG. 6, showing the points 605 and RC model line fit 615 in the high to mid frequency of the large Nyquist plot 600. Again, at each frequency, the associated point on the Nyquist plot 650 represents the real component, Z', of total impedance of the cell (100, 200) as measured in ohms on the x-axis 664 versus the imaginary component, Z", of total impedance as measured in ohms on the y-axis 665 of the Nyquist plot 650.

In this plot, the value 675 of R1 represents the silicon-based electrode 110 and layer pair interface resistance, which is determined to be 17 ohms. The value is extracted from the diameter of the small semicircle in the high frequency region, as indicated with the black arrow pointing from R1. The value 685 of R2 is determined to be 1114 ohms. It is proposed that the value of R2, the bulk cell resistance which represents the mass transport and diffusion resistance through electrolyte and electrodes, could be further decreased by reducing the thickness 121 of the SPE electrolyte and potentially the layer pair. Rs is estimated as the real resistance (X-axis value) from the first, highest frequency data point.

Prior art symmetric cell/batteries of the same dimensions, without a layer pair 150 between the silicon-based electrode 110 and the SPE 114 have an R1 value in a range around 150 ohms and an R2 value in a range around 4527 ohms. Therefore, by including the layer pair 1500, the value of R1 improves by a factor of nearly 10 and the value of R2 improves by a factor of about 4.

Stated another way, the resistance values of R1 and R2 can be normalize with respect to the 1.88 cm² area of the silicon-based electrode 110 result in a cell/battery 100/200 with a R1, a silicon-based interface resistivity, of 32 ohm-cm² (or less than 40 ohm-cm²) and a R2, a bulk cell resistivity, of 2094 ohm-cm² (or less than $2\times10^3$ ohm-cm²). Additionally, the time constants (the amount of time it takes charge current to pass through the representative material) for the R1/C1 and R2/CPE1 parallel RC components are 2.25E-6 seconds and 1.26E-2 seconds; where the capacitance (1.137E-5 F) from CPE1 was calculated from the following formula:

$$C_{CPE} = R^{\left(\frac{1-n}{n}\right)} Q^{\frac{1}{n}};$$

where R=R2, n=pre-exponential factor (CPE-P from RC fitting) and Q=pseudo capacitance (CPE-T from RC model fitting).

Figure 7:
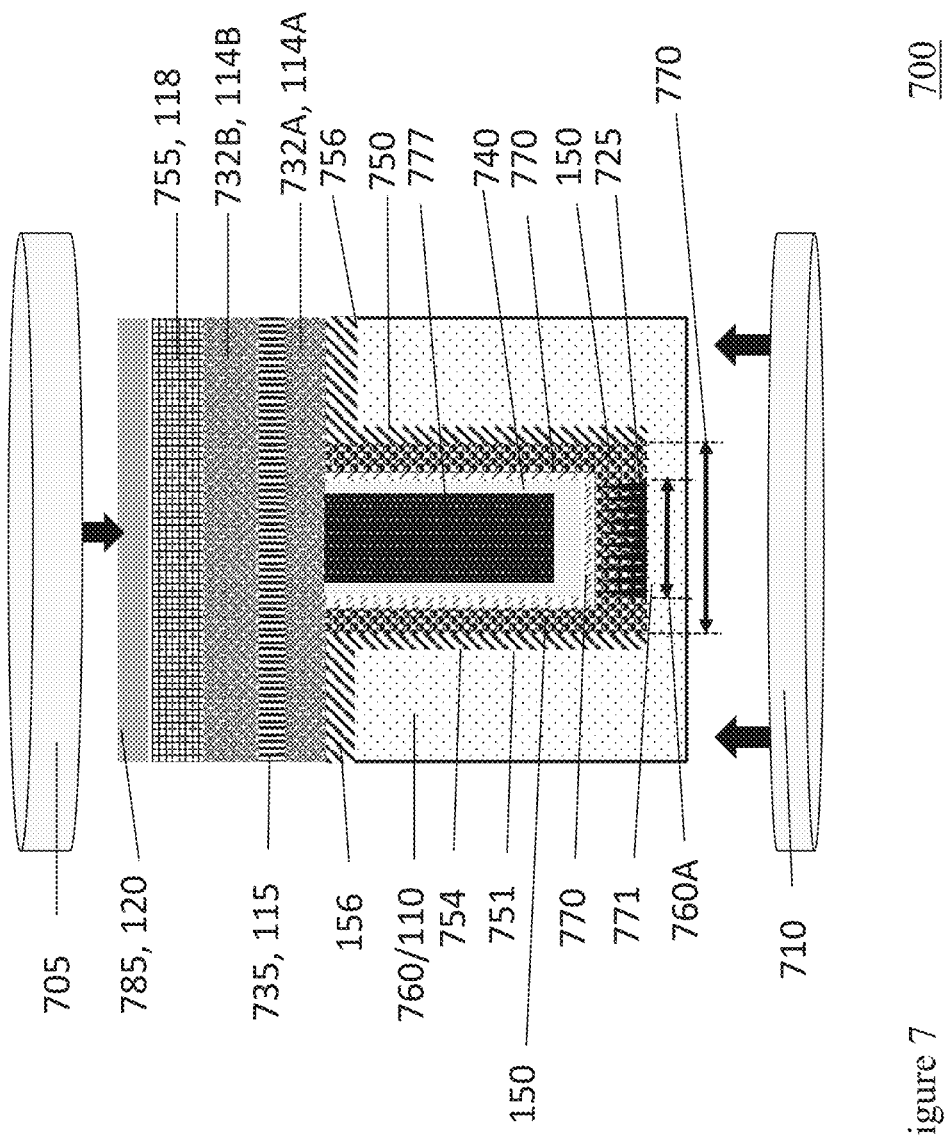
FIG. 7 is a block diagram showing the layer pair disposed on a silicon-based electrode used in a lithium battery.

FIG. 7 is a block diagram showing the layer pair 110 disposed on a silicon-based electrode used in a 3D patterned full lithium battery cell 700.

FIG. 7 is a block diagram of a novel energy storage device 700 with active anode material (LiTFSI-PANI & graphite slurry) layered on an active silicon region 760A/110 in a silicon-based electrode substrate 110/760. The active anode material 777 is at the base of a trench 750 and on the trench sidewalls 754 which is formed in the partially in-situ structure 700 during initial current cycling and before formation of a lithium metal anode layer 740.

In this embodiment, the structure 700, as an example, has the anode 777 is completely within the confines of the 3D trench 750 of the substrate 110/760. In this non-limiting example, the cathode contact 785/118, separator 735/115, and electrolyte (732A/732B) are outside of the trench 750 and disposed on the field 756. The field 756 is the surface of the substrate 760/110 outside of the trench 750. Additionally, the active anode material 777, the polymer 770, and, upon cycling or in-situ, a lithium metal anode layer 740 is layered on the trench sidewalls 754 and trench base 771. Structure 700 is shown after being cycled, e.g. being exposed to current of varying amplitude through the battery 700, to form structures and components within the battery 700.

The battery structure 700 is partially encapsulated in the trench 750 of the substrate 760/110. A liner/insulator 754 covers the sidewalls 751 of the trench 750 and can overlap on the field 756. The liner 754 is made of a dielectric, electrically insulating material like Silicon Dioxide ($SiO_2$) or Silicon Nitride ($Si_3N_4$) or a combination of the multiple insulating layers, deposited by known methods.

The liner 754 does not cover the active surface 760A/110 of the trench base 771, the surface of the trench bottom area 770 between the liner 754 layers on the sidewalls 751 of the trench 750. The electrically active surface 760A/110 at the trench base 771 is the area where the trench 750 initially interfaces with the substrate 760/110 before galvanic cycling causes the transformations at these surfaces to initially form a lithiated substrate region 760A and a lithium metal layer 740 on the trench base 771.

In some embodiments, the pair layer 150 is deposited over the active surface 725 and partially or entirely over the insulated layer 754 on the sidewalls 751. In still other embodiments, the pair layer 150 deposits entirely on insulated layer 754 and on the field 756 of the substrate 760/110. The different layering of the pair layer 150 are performed by known masked deposition techniques.

In some embodiments, an adhesive region 770 is a layer that covers the trench base 771 and the sidewalls 751 of the trench 750.

In some embodiments, an anode composition (e.g., graphite mixture and lithium/electron conductive adhesive) 777 also covers the sidewalls 751 of the trench 750.

In some embodiments, the battery structure 700 has an electrolyte layer 732A/114A and 732B/114B with a separator layer 735/115. In some embodiments, the electrolyte layer(s) 732A/732B is (are) a solid polymer electrolyte (SPE), for example, as described above. However, any electrolyte material would function in the structure 700.

The cathode 755/118 is electrically connected to a cathode contact 785/120 which is a conductive material, e.g. a metal like Aluminum (Al), and/or other conductive materials described above. In some embodiments, the cathode contact 785/120 is connected to another top outside contact 705 like a coin cell conductive spacer and/or casing.

In some embodiments, a bottom outside contact 710, like a coin cell casing is attached to the substrate 760/110.

Figure 8:
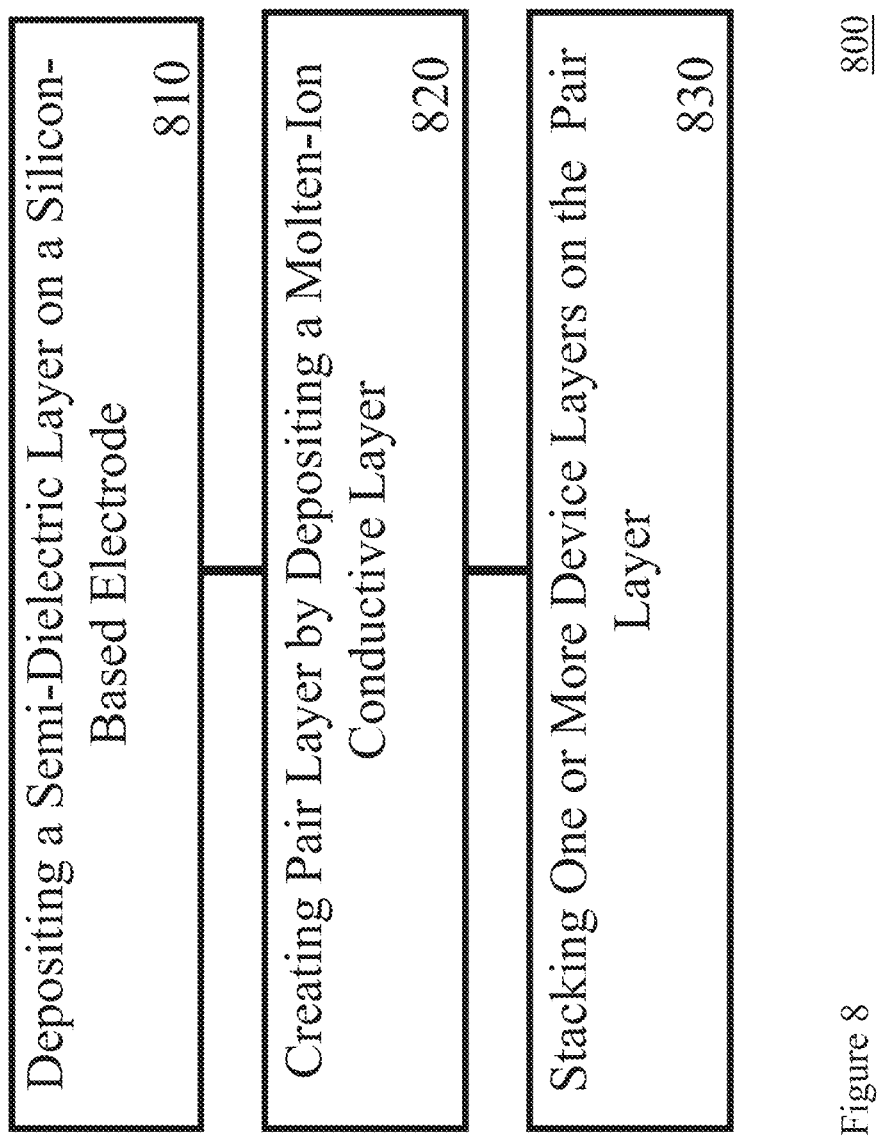
FIG. 8 is a flow chart of a process of making a lithium battery using the layer pair to substantial reduce the resistance at the interface with the silicon-based electrode.

FIG. 8 is a flow chart of a method of making or process 800 a lithium battery using the layer pair 150 so the battery has an electrode interface resistivity, R1, of less than 40 ohm-cm² (corresponding to a charge-transfer time constant of 2.25E-6 seconds) and a bulk cell resistivity, R2, of less than 2×10³ ohm-cm². (corresponding to a charge-transfer time constant of 1.26E-2 seconds).

The process 800 begins with step 810 which forms the thin semi-dielectric layer 111 on the silicon-based electrode 110, as described above. The thin semi-dielectric layer 111 has a thin semi-dielectric layer thickness 121 of 15 nanometers (nm) and 30 nm.

In step 820, the molten-ion conductive layer 112 is deposited on the thin semi-dielectric layer 111 to form the layer pair 150, as described above.

In step 830 one or more device layers is stacked upon the layer pair 150 to form the device 100/200/700.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. An energy storage device comprising:
   a composite electrode comprising:
      a silicon-based electrode;
      a semi-dielectric layer directly disposed on the silicon-based electrode, the semi-dielectric layer having a semi-dielectric layer thickness between 15 nanometers (nm) and 30 nm;
      a molten-ion conductive layer disposed on the semi-dielectric layer, the molten-ion conductive layer and semi-dielectric layer forming a layer pair, the molten-ion conductive layer being made of a lithium containing salt that is highly conductive to lithium ions, the layer pair being on a trench bottom of a trench in the silicon-based electrode;
   an anode disposed on the composite electrode and within the trench;
   an electrolyte layer disposed on the anode;
   a cathode electrode disposed on the electrolyte layer; and
   a separator layer preventing electrode flow between the anode and the cathode, wherein the composite electrode has a resistivity less than 40 ohm-cm².

2. The composite electrode, as in claim 1, with a charge-transfer time constant of less than 2.25E-6 seconds.

3. The composite electrode, as in claim 1, where the semi-dielectric layer thickness is between 18 nm and 23 nm.

4. The composite electrode, as in claim 1, where the semi-dielectric layer is made of a lithium compound.

5. The composite electrode, as in claim 4, where the lithium compound is one or more of the following: lithium fluoride, LiF, lithium niobium oxide, lithium aluminate (LiAlO₂), lithium titanate (Li₂TiO₃), and lithium niobite (LiNbO₃).

6. The composite electrode, as in claim 4, where the lithium compound is a lithiated version of one or more of the following: titanium dioxide, niobium oxide, rubidium oxide, tungsten oxide, aluminum oxide, zinc oxide, and zirconium oxide.

7. The composite electrode, as in claim 1, where the where the semi-dielectric layer is made of one or more of the following: titanium dioxide, niobium oxide, rubidium oxide, tungsten oxide, aluminum oxide, zinc oxide, and zirconium oxide.

8. The composite electrode, as in claim 1, where the lithium containing salt is one or more of the following materials: lithium hexafluorophosphate, lithium perchlorate, lithium trifluoromethanesulfonate, lithium fluoride, LiBF₄, LiBF₆, lithium chloride, lithium phosphate compounds, lithium bromide compounds, lithium bis(trifluoromethanesulfonyl)imide (LiTFSI), lithium difluoro(oxalato)borate (LiDFOB), and lithium bis(oxalato)borate(LiBOB).

9. The composite electrode, as in claim 1, where the molten-ion conductive layer has a molten-ion conductive layer thickness between 1 nm to 50 nm.

10. The composite electrode, as in claim 1, where the silicon-based electrode is made of one or more of the following materials: a bulk silicon, a crystalline silicon, a non-crystalline silicon, a doped silicon, a boron doped silicon, a porous silicon, a non-porous silicon, a silicon germanium alloy, and a carbon-doped silicon-based alloy.

11. The composite electrode, as in claim 1, further comprising an electrode contact made of one or more of the following: a conductive material, a metal, a metal nitride, tungsten (W), copper (Cu), titanium (Ti), platinum (Pt), nickel (Ni), aluminum (Al), gold (Au), and titanium nitride (TiN).

12. The composite electrode, as in claim 1, where the layer pair is directly disposed on a silicon-based electrode so that a pair bottom surface of the layer pair is in direct physical and electrical contact with an electrode pair surface of the silicon-based electrode, and where an electrode interface is where the pair bottom surface and the electrode pair surface are in contact.

13. The device, as in claim 1, where the electrolyte layer is one of the following: a solid polymer electrolyte (SPE), a solid electrolyte, a hybrid polymer/solid electrolyte, and a liquid electrolyte.

14. The device, as in claim 10, composed of the composite have a charge-transfer time constant of less than 2.25E-6 seconds.

15. The device, as in claim 10, where the silicon-based electrode is made of a boron doped crystalline silicon, the semi-dielectric layer is made of LiF, the molten ion conductive layer is made of bis(trifluoromethanesulfonyl)imide (LiTFSI), and the electrolyte layer is made of a solid polymer electrolyte (SPE) which further is made from a mixture of polycaprolactone, succinonitrile (SN), and lithium bis(trifluoromethanesulfonyl)imide (LiTFSI).

* * * * *